(12) United States Patent
Weinstein et al.

(10) Patent No.: US 7,300,874 B2
(45) Date of Patent: Nov. 27, 2007

(54) CHEMICAL MECHANICAL POLISHING COMPOSITIONS AND METHODS RELATING THERETO

(75) Inventors: Barry Weinstein, Dresher, PA (US); Tirthankar Ghosh, Oreland, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 503 days.

(21) Appl. No.: 11/077,671

(22) Filed: Mar. 10, 2005

(65) Prior Publication Data

US 2005/0159003 A1 Jul. 21, 2005

Related U.S. Application Data

(62) Division of application No. 10/664,723, filed on Sep. 17, 2003, now Pat. No. 6,902,590, which is a division of application No. 09/860,933, filed on May 18, 2001, now Pat. No. 6,632,259.

(51) Int. Cl.
*H01L 21/302* (2006.01)
*H01L 21/461* (2006.01)

(52) U.S. Cl. ............... 438/689; 438/690; 438/691; 438/692; 438/693; 51/298; 51/307; 51/308; 51/309

(58) Field of Classification Search ........ 438/689–693; 51/307–309
See application file for complete search history.

*Primary Examiner*—Duy-Vu N. Deo
*Assistant Examiner*—Patricia A. George
(74) *Attorney, Agent, or Firm*—Blake T. Biederman

(57) ABSTRACT

A method for chemical mechanical polishing of semiconductor substrates containing a metal layer requiring removal and metal interconnects utilizing a composition containing engineered copolymer molecules comprising hydrophilic functional groups and relatively less hydrophilic functional groups; the engineered copolymer molecules enabling contact-mediated reactions between the polishing pad surface and the substrate surface during CMP resulting in minimal dishing of the metal interconnects in the substrate.

19 Claims, No Drawings

CHEMICAL MECHANICAL POLISHING COMPOSITIONS AND METHODS RELATING THERETO

This application is a DIV of 10/664,723 of Sep. 17, 2003 now U.S. Pat. No. 6,902,590 which is a DIV of 09/860,933 of May 18, 2001 now U.S. Pat. No. 6,632,259.

This invention relates to the use of certain engineered copolymers for chemical mechanical polishing (CMP) of semiconductor (and similar-type) substrates and methods relating thereto.

Broadly speaking, CMP is an enabling technology for the production of semiconductor structures and is an effective method for the removal and planarization of thin films or layers on semiconductor substrates during their production. Such semiconductor substrates often contain integrated circuits, such as, multi-chip modules, capacitors and the like. During the CMP process, a slurry or substantially particle-free polishing fluid (collectively referred to herein as a polishing composition) is used along with a polishing pad. The polishing pad motion (relative to the semiconductor substrate) in combination with the polishing fluid's chemical reaction with the substrate surface generally results in material removal from the semiconductor substrate surface.

Semiconductor substrates used to make integrated circuits typically contain three different layers: (i) a conductive metal layer; (ii) a barrier (or liner) film between the conductive metal layer and the underlying dielectric layer; and (iii) an underlying dielectric layer typically having recessed metal lines (metal interconnects) that form the circuit interconnects in the integrated circuit.

The term "dishing" refers to excessive (unwanted) removal of metal from the metal interconnect precursors during CMP, thereby causing unwanted cavities in the interconnect structure. Dishing is undesirable, since it negatively affects the electrical performance of the semiconductor structure (integrated circuit). Similarly, the term "erosion" refers to excessive removal of dielectric material surrounding metal interconnects during CMP. Erosion is undesirable, since the dielectric layer should ideally be flawless and free of cavities to ensure optimal electrical performance of the semiconductor structure (integrated circuit).

CMP is typically used to polish the semiconductor substrate to a smooth planar polished surface on which are manufactured successive layers, which themselves can be polished by CMP. Thus, excessive dishing of interconnects (recessed in the underlying dielectric layer) and erosion of the dielectric layer surrounding the interconnects in the first layer can manifest as defects in a successive layer of a multi-layered semiconductor substrate. Semiconductors having copper circuits can be particularly difficult to polish using conventional polishing compositions, polishing pads and techniques.

The use of polyacrylic acid and polymethacrylic acid for CMP of semiconductor wafers is disclosed in U.S. Pat. No. 6,117,775.

This invention is directed to the use of certain engineered copolymers for enhanced removal of metal during CMP of semiconductor substrates, and such use can also often provide suppression of dishing in metal interconnects in semiconductor substrates. The engineered copolymer molecules for use in this invention can comprise a first moiety having at least one hydrophilic functional group such as carboxyl, hydroxyl, halogen, phosphonate, phosphate, sulfonate, sulfate, nitro and the like and a second moiety which is less hydrophilic than the first moiety. The second moiety can comprise one or more hydrophobic functional groups. The first moiety of the engineered copolymer molecules of this invention will typically align or otherwise forms bonds (preferably coordinate covalent bonds) with the substrate surface. Depending upon the embodiment selected, the second moiety of the engineered copolymer molecules often provides structural rigidity to the engineered copolymer molecules and can also enable interaction of the engineered copolymer molecules with the polishing pad surface.

Thus, the methods and compositions of this invention generally enhance the removal rate of metal from a substrate surface containing metal interconnects during CMP, while also typically minimizing dishing of the metal interconnects through controlled contact-mediated reactions between the substrate surface and the polishing pad surface.

In an embodiment, this invention is directed to suppression of dishing and enhanced clearing of metal during CMP of semiconductor or similar-type substrates, particularly substrates with metal interconnects. The polishing compositions of this embodiment preferably contain engineered copolymer molecules and can be used to polish semiconductor or similar-type substrates utilizing commercially available or the like polishing pads.

The term "engineered" means that the copolymers for use in the methods of this invention are derived by a judicious choice of monomers. In an embodiment, the copolymer for use in the method of this invention is engineered from monomers to contain hydrophilic functional groups that readily form strong bonds, e.g. coordinate covalent bonds, with the substrate surface. In this embodiment, the hydrophobic functional groups provide structural rigidity to the copolymer molecule and optionally also interact with the polishing pad surface through van der Waals forces or other interactions. The engineered copolymer enhances the removal rate of metal from the substrate surface during CMP, while minimizing dishing of metal interconnects through controlled contact-mediated reactions.

In an embodiment, hydrophilic functional groups are ionizable functional groups while the hydrophobic functional groups are non-ionizable functional groups. The term "up to" as used herein is intended to include zero as a lower limit and to further include the identified value as an upper limit (and all values in between), i.e., "up to about X," means values in a continuous range including 0 up to a value which may not be precisely X but which would be deemed to be sufficiently close to X as a practical matter to those skilled in the art, depending upon the particular embodiment or end use under consideration. Additionally, all percentages are on a weight basis unless otherwise specified.

In an embodiment, the method of this invention is performed on semiconductor substrates containing metal interconnects, preferably copper interconnects, utilizing a reactive liquid comprising a blend of one or more engineered copolymers. The copolymers are preferably present up to about 1% by weight, and each copolymer is derived from a mixture of monomers having hydrophilic functional groups and relatively less hydrophilic (hydrophobic) functional groups. The reactive liquid of this embodiment may also include: (i) up to about 15% by weight of an oxidizing agent; (ii) up to about 2% by weight of a corrosion inhibitor; and (iii) up to about 3% by weight of a complexing agent.

In an embodiment, the method of this invention is performed on semiconductor substrates containing metal interconnects, preferably copper interconnects, utilizing a reactive liquid having a pH under about 5.0, preferably in a range of about 2.8 to about 4.2, more preferably in a range of about 2.8 to about 3.8. The reactive liquid can comprise a blend of one or more engineered copolymers, typically up to about 1% by weight. Each copolymer is typically derived from a mixture of monomers having hydrophilic functional groups and hydrophobic (relatively less hydrophilic) functional groups. The reactive liquid of this embodiment may also include: (i) up to about 15% by weight of an oxidizing agent; (ii) up to about 2% by weight of a corrosion inhibitor; and (iii) up to about 3% by weight of a complexing agent.

In an embodiment, the method of this invention is performed on a semiconductor substrate containing metal interconnects, preferably copper interconnects, utilizing a reactive liquid comprising: (i) up to about 1% by weight of an engineered copolymer derived from an acrylic acid monomer and methacrylic acid monomer at a mole ratio in a range of about 1:20 to about 20:1, preferably 1:1; (ii) up to about 15% by weight of an oxidizing agent; (iii) up to about 2% by weight of a corrosion inhibitor; and (iv) up to about 3% by weight of a complexing agent.

In an embodiment, the method of this invention is performed on semiconductor substrates, such as, patterned wafers with metal interconnects, preferably copper interconnects, utilizing a reactive liquid having: (i) a pH under about 5.0; (ii) up to about 1% by weight of one or more engineered copolymers, each engineered copolymer derived from a mixture of monomers having hydrophilic functional groups and hydrophobic functional groups; (iii) up to about 15% by weight of an oxidizing agent; (iv) up to about 2% by weight of an inhibitor; and (v) up to about 3.0% by weight of a complexing agent.

In an embodiment, the method of this invention is performed on semiconductor substrates such as patterned wafers with metal interconnects, preferably copper metal interconnects, utilizing an aqueous polishing composition having: (i) a pH under about 5.0, further comprising: (ii) up to about 1% by weight of a blend of one or more engineered copolymers, each engineered copolymer derived from a mixture of monomers having hydrophilic functional groups and relatively less hydrophilic (hydrophobic) functional groups; (iii) up to about 3% by weight of abrasive particles; (iv) up to about 15% by weight of an oxidizing agent; (v) up to about 2% by weight of an inhibitor; and (vi) up to about 3.0% by weight of a complexing agent.

In an embodiment, the method of this invention is performed on a semiconductor substrate containing metal interconnects, preferably copper interconnects, utilizing engineered random copolymer molecules derived from a mixture of two or more ethylenically unsaturated monomers, said mixture containing at least about 50% by weight of an unsaturated carboxylic acid monomer.

In an embodiment, the method of this invention is performed on a semiconductor substrate containing metal interconnects, preferably copper interconnects, utilizing engineered branched copolymer molecules derived from a mixture of two or more ethylenically unsaturated monomers, said mixture containing at least about 50% by weight of an unsaturated carboxylic acid monomer.

In an embodiment, the method of this invention is performed on a semiconductor substrate containing metal interconnects, preferably copper interconnects, utilizing engineered block copolymer molecules derived from a mixture of two or more ethylenically unsaturated monomers, said mixture containing at least about 50% by weight of an unsaturated carboxylic acid monomer.

In an embodiment, the method of this invention is performed on a semiconductor substrate containing metal interconnects, preferably copper interconnects, utilizing engineered alternating copolymer molecules derived from a mixture of two or more ethylenically unsaturated monomers, said mixture containing at least about 50% by weight of an unsaturated carboxylic acid monomer.

In an embodiment, the engineered copolymers can be derived from a monomer that is an unsaturated carboxylic acid monomer, such as an ethylenically unsaturated carboxylic acid monomer. "Unsaturated carboxylic acid monomer," as used herein, is either an unsaturated monocarboxylic acid monomer or an unsaturated dicarboxylic acid monomer. An unsaturated monocarboxylic acid monomer, as used herein, refers to unsaturated carboxylic acid monomers containing 3 to 6 carbon atoms per molecule with a single carboxylic acid group and water-soluble salts thereof. Suitable ethylenically unsaturated monocarboxylic acid monomers are, for example, acrylic acid, oligomeric acrylic acid, methacrylic acid, crotonic acid, vinylacetic acid and derivatives thereof such as corresponding anhydrides, amides, esters and water-soluble salts thereof. An unsaturated dicarboxylic acid monomer, as used herein, refers to unsaturated dicarboxylic acid monomers containing 4 to 8 carbon atoms per molecule, anhydrides of the cis-and trans-dicarboxylic acids, and water-soluble salts thereof. Suitable unsaturated dicarboxylic acid monomers useful in the process of the present invention include, for example, maleic acid, fumaric acid, alpha-methylene glutaric acid, itaconic acid, citraconic acid, mesaconic acid, cyclohexenedicarboxylic acid, and derivatives such as corresponding anhydrides, amides, esters and water-soluble salts thereof.

In another embodiment, the engineered copolymer for use in this invention is derived from other monoethylenically unsaturated monomers such as vinylaromatic monomers that include, for example, styrene, α-methylstyrene, vinyltoluene, ortho-, meta- and para-methylstyrene, ethylvinylbenzene, vinylnaphthalene and vinylxylenes. The vinylaromatic monomers can also include their corresponding substituted counterparts, for example, halogenated derivatives, that is, containing one or more halogen groups, such as fluorine, chlorine or bromine; and nitro, cyano, alkoxy, haloalkyl, carbalkoxy, carboxy, amino and alkylamino derivatives. Yet another class of suitable monoethylenically unsaturated monomers is nitrogen-containing ring compounds, for example, vinylpyridine, 2-methyl-5-vinylpyridine, 2-ethyl-5-vinylpyridine, 3-methyl-5-vinylpyridine, 2,3-dimethyl-5-vinylpyridine, 2-methyl-3-ethyl-5-vinylpyridine, methyl-substituted quinolines and isoquinolines, 1-vinylimidazole, 2-methyl-1-vinylimidazole, N-vinylcaprolactam, N-vinylbutyrolactam and N-vinylpyrrolidone. Monoethylenically unsaturated monomers also comprise ethylene and substituted ethylene monomers, for example: α-olefins such as propylene, isobutylene and long chain alkyl α-olefins (such as ($C_{10}$-$C_{20}$)alkyl α-olefins); vinyl alcohol esters such as vinyl acetate and vinyl stearate; vinyl halides such as vinyl chloride, vinyl fluoride, vinyl bromide, vinylidene chloride, vinylidene fluoride and vinylidene bromide; vinyl nitriles such as acrylonitrile and methacrylonitrile.

In another embodiment, the engineered copolymer for use in this invention is derived from the polymerization of acrylic monomers and alkyl methacrylate monomers. Examples of the alkyl methacrylate monomer where the alkyl group contains from 1 to 6 carbon atoms (also called the "low-cut" alkyl methacrylates), are methyl methacrylate (MMA), methyl and ethyl acrylate, propyl methacrylate, butyl methacrylate (BMA) and butyl acrylate (BA), isobutyl methacrylate (IBMA), hexyl and cyclohexyl methacrylate, cyclohexyl acrylate and combinations thereof. Examples of the alkyl methacrylate monomer where the alkyl group contains from 7 to 15 carbon atoms (also called the "midcut" alkyl methacrylates), are 2-ethylhexyl acrylate (EHA), 2-ethylhexyl methacrylate, octyl methacrylate, decyl methacrylate, isodecyl methacrylate (IDMA, based on branched ($C_{10}$)alkyl isomer mixture), undecyl methacrylate, dodecyl methacrylate (also known as lauryl methacrylate), tridecyl methacrylate, tetradecyl methacrylate (also known as myristyl methacrylate), pentadecyl methacrylate and combinations thereof. Also useful are: dodecyl-pentadecyl methacrylate (DPMA), a mixture of linear and branched isomers of dodecyl, tridecyl, tetradecyl and pentadecyl methacrylates; and lauryl-myristyl methacrylate (LMA), a mixture of dodecyl and tetradecyl methacrylates. Examples of alkyl methacrylate monomers where the alkyl group contains from 16 to 24 carbon atoms (also called the "high-cut" alkyl methacrylates), are hexadecyl methacrylate (also known as cetyl methacrylate), heptadecyl methacrylate, octadecyl methacrylate (also known as stearyl methacrylate), nonadecyl methacrylate, eicosyl methacrylate, behenyl methacrylate and combinations thereof. Also useful are: cetyl-eicosyl methacrylate (CEMA), a mixture of hexadecyl, octadecyl, and eicosyl methacrylate; and cetyl-stearyl methacrylate (SMA), a mixture of hexadecyl and octadecyl methacrylate.

Additional examples of monomers that are used to derive the engineered copolymer for use in this invention are those alkyl methacrylate and acrylate monomers with a dialkylamino group in the alkyl radical, such as dimethylaminoethyl methacrylate, dimethylaminoethyl acrylate; dialkylaminoalkyl methacrylamide and acrylamide monomers, such as N,N-dimethylaminoethyl methacrylamide, N,N-dimethylaminopropyl methacrylamide, N,N-dimethylaminobutyl methacryl-amide, N,N-diethylaminoethyl methacrylamide, N,N-diethylaminopropyl methacrylamide and N,N-diethylaminobutyl methacrylamide. Alkyl methacrylate and acrylate monomers with one or more hydroxyl groups in the alkyl radical, especially those where the hydroxyl group is found at the β-position (2-position) in the alkyl radical. Hydroxyalkyl methacrylate and acrylate monomers in which the substituted alkyl group is a ($C_2$-$C_6$) alkyl, branched or unbranched, are preferred. Among the hydroxy-alkyl methacrylate and acrylate monomers suitable for use in the present invention are 2-hydroxyethyl methacrylate (HEMA), 2-hydroxyethyl acrylate, 2-hydroxypropyl methacrylate, 1-methyl-2-hydroxyethyl methacrylate, 2-hydroxypropyl acrylate, 1-methyl-2-hydroxyethyl acrylate, 2-hydroxybutyl methacrylate and 2-hydroxybutyl acrylate. The preferred hydroxy-alkyl methacrylate and acrylate monomers are HEMA, 1-methyl-2-hydroxyethyl methacrylate and 2-hydroxypropyl methacrylate. A mixture of the latter two monomers is commonly referred to as "hydroxypropyl methacrylate" or HPMA, which is the more preferred. hydroxyalkyl methacrylate, as are each of the components of HPMA.

Amine-containing monomers suitable for use in the present invention include, for example, amide monomers such as dialkylaminoalkyl acrylamides or methacrylamides (for example, dimethylaminopropyl methacrylamide), N,N-bis-(dimethylaminoalkyl) acrylamides or methacrylamides, N-β-aminoethyl acrylamide or methacrylamide, N-(methylamino-ethyl)acrylamide or methacrylamide, aminoalkylpyrazine acrylamides or methacrylamides; acrylic ester monomers such as dialkylaminoalkyl acrylates or methacrylates (for example, dimethylaminoethyl acrylate or methacrylate), β-aminoethyl acrylate or methacrylate, N-(n-butyl)-4-aminobutyl acrylate or methacrylate, methacryloxyethoxyethylamine, and acryloxypropoxypropoxypropylamine; vinyl monomers such as vinyl pyridines; aminoalkyl vinyl ethers or sulfides such as β-aminoethyl vinyl ether, β-aminoethyl vinyl sulfide, N-methyl-β-aminoethyl vinyl ether or sulfide, N-ethyl-β-aminoethyl vinyl ether or sulfide, N-butyl-β-aminoethyl vinyl ether or sulfide, and N-methyl-3-aminopropyl vinyl ether or sulfide; N-acryloxyalkyloxazolidines and N-acryloxyalkyltetrahydro-1,3-oxazines such as oxazolidinylethyl methacrylate, oxazolidinylethyl acrylate, 3-(γ-methacryloxypropyl)tetrahydro-1,3-oxazine, 3-(β-methacryloxyethyl)-2,2-pentamethylene-oxazolidine, 3-(β-methacryloxyethyl)-2-methyl-2-propyl-oxazolidine, N-2-(2-acryloxyethoxy)ethyl-oxazolidine, N-2-(2-meth-acryloxyethoxy)-ethyl-5-methyl-oxazolidine, 3-[2-(2-methacryloxyethoxy)ethyl]-2,2-dimethyloxazolidine, N-2-(2-acryloxyethoxy)ethyl-5-methyl-oxazolidine, 3-[2-(methacryloxyethoxy)-ethyl]-2-phenyl-oxazolidine, N-2-(2-methacryloxyethoxy)ethyl-oxazolidine, and 3-[2-(2-methacryloxyethoxy)ethyl]-2,2-pentamethylene-oxazolidine.

The engineered copolymer for use in this invention can also be derived from a monomer with an unsaturated sulfonic acid monomer selected from one or more of 2-acrylamido-2-methyl-1-propanesulfonic acid, 2-methacrylamido-2-methyl-1-propanesulfonic acid, 3-methacrylamido-2-hydroxy-1-propanesulfonic acid, allylsulfonic acid, allyloxybenzenesulfonic acid, 2-hydroxy-3-(2-propenyloxy)propanesulfonic acid, 2-methyl-2-propene-1-sulfonic acid, styrene sulfonic acid, vinyl sulfonic acid, 3-sulfopropyl acrylate, 3-sulfopropyl methacrylate and water-soluble salts thereof.

Engineered copolymers derived from combinations of the aforementioned classes of monomers are used in various embodiments of this invention. Henceforth, the term "engineered copolymer" includes copolymers derived from polymerization of monomers selected from the aforementioned classes of monomers. The term copolymer includes the various embodiments: random copolymers, branched copolymers, block copolymers and alternating copolymers.

Material removal during CMP of semiconductor substrates is through contact-mediated reactions between the substrate surface and the polishing pad surface in the presence of a polishing composition. U.S. Pat. No. 5,489,233 teaches the importance of macro-texture and micro-texture on the polishing pad surface in controlling material removal rates during CMP and is herein incorporated by reference.

U.S. Pat. No. 5,932,486 teaches a method for polishing semiconductor substrates utilizing a reactive liquid and a polishing pad having nanoasperities (micro-texture) for CMP of semiconductor substrates. U.S. Pat. No. 5,932,486 also teaches the importance of a polishing pad having nanoasperities and chemically reactive liquid solutions to effect contact-mediated reactions and is herein incorporated by reference.

Polyacrylic acid (PAA) can be used in polishing compositions for CMP of copper substrates to lower removal of copper and lower dishing of copper in metal lines on the substrate surface. Polymethacrylic acid (PMAA), a homopolymer of methacrylic acid, when used in polishing compositions for CMP of copper substrates can be used for improved clearing of copper residuals with higher dishing of copper in metal lines on the substrate.

The copolymer for use in some embodiments of this invention can be engineered from monomers with specific hydrophilic functional groups and specific hydrophobic functional groups. In an embodiment, the engineered copolymers of this invention also have a specific rigidity by varying the mole ratio of the specific monomers. An exemplary engineered copolymer is synthesized utilizing acrylic acid monomer and methacrylic acid monomer at a mole ratio in a range of about 1:20 to about 20:1, preferably about 1:1 (±25%). Where two monomers are utilized to synthesize the copolymer, the mole ratio of each monomer can be varied from about 1:20 to about 20:1. Where more than two monomers are used to generate the copolymer, the mole ratios of the various monomers can be optimized such that the total of all mole ratios is 1. In an embodiment, the engineered copolymer of this invention is generated from at least two monomers wherein one monomer is polyethylenically unsaturated and serves as the extending (crosslinking) agent in the copolymer.

Removal of material (for e.g. copper) from the substrate surface during CMP utilizing a polishing composition containing a corrosion inhibitor (for e.g. benzotriazole) and engineered copolymer molecules derived from monomers having hydrophilic functional groups and hydrophobic functional groups typically involves constant redistribution and competitive binding between the corrosion inhibitor molecules, the engineered copolymer molecules and the substrate surface. Hydrophilic functional groups of many of the above described engineered copolymer molecules can often form strong bonds, for e.g. coordinate covalent bonds, with the substrate surface. The substrate surface comprises hydrated metal atoms and hydrated metal atom-corrosion inhibitor molecular complexes. An exemplary copper substrate during CMP with the method of this invention contains hydrated copper atoms and hydrated copper atom-BTA complexes. Hydrophobic functional groups of many of the above-described engineered copolymer molecules form strong van der Waals bonds with nanoasperities on the polishing pad surface. Thus, the method of this invention when applied to substrates containing metal interconnects results in metal removal and minimal dishing of metal interconnects through controlled contact-mediated reactions.

Polishing compositions used in CMP typically contain abrasive particles that include but are not limited to alumina, silica, ceria, germania, diamond, silicon carbide, titania, zirconia and various mixtures thereof. In an embodiment, the polishing composition of this invention does not contain any abrasive particles. In another embodiment, the polishing composition contains low levels of abrasives in a range from about 0 to about 3%, with an average particle diameter less than 50 nm. In other embodiments, the weight % of abrasive can be up to about 50%.

Oxidizing agents used in polishing compositions for CMP include but are not limited to peroxides such as hydrogen peroxide, iodates such as potassium iodate, nitrates such as cesium nitrate, barium nitrate, ammonium nitrate, and/or mixtures of ammonium nitrate and cesium nitrate, carbonates such as ammonium carbonate, and persulfates such as ammonium persulfate and/or sodium persulfate and perchlorates.

Complexing agents used in polishing compositions for CMP include but are not limited to straight chain mono-and dicarboxylic acids and their corresponding salts such as malic acid and malates; tartaric acid and tartarates; gluconic acid and gluconates; citric acid and citrates; malonic acid and malonates; formic acid and formates; lactic acid and lactates; phthalic acid and phthalates. Polyhydroxybenzoic acid and its salts can also be used in the polishing composition of this invention. Complexing agents include a carboxylic acid containing two or more carboxylate groups with hydroxy groups as disclosed in Brancaleoni et al U.S. Pat. No. 5,391,258 issued Feb. 21, 1995, which is herein incorporated by reference.

Corrosion inhibitors used in polishing compositions for CMP include BTA (benzotriazole) and TTA (tolyltriazole) or mixtures thereof. Other inhibitors that are suitable for use include: 1-hydroxybenzotriazole,N-(1H-benzotriazole-1-yl-methyl)formamide; 3,5-dimethylpyrazole; indazole; 4-bromopyrazole; 3-amino-5-phenylpyrazole; 3-amino-4-pyrazolecarbonitrile; 1-methyimidazole; Indolin QTS and the like.

Polishing compositions used for CMP also contain pH buffers such as amines, and may contain surfactants, deflocculants, viscosity modifiers, wetting agents, cleaning agents and the like. The polishing composition of this invention can be used with any conventional polishing pad or non-conventional polishing pad.

The following examples illustrate various aspects of this invention. All parts and percentages are on a weight basis (i.e., by weight of the polishing composition) and all molecular weights are determined by gel permeation chromatography (GPC) and are weight-average molecular weights unless otherwise indicated.

EXAMPLE 1

Engineered copolymers I and II were synthesized as described below. All molecular weights were determined utilizing GPC analysis according to the following procedure.

Molecular weight Determination: Samples were dissolved in 0.02M sodium dihydrogen phosphate at pH 7 at a concentration of approximately 0.1% w/v and shaken for 10 minutes, followed by filtration through a 0.45 micron PTFE membrane filter. The analysis was performed by injecting 100 microliters of this solution into a 2-column set consisting of a TosoHaas TSKgel GMPWx1 and a TosoHaas TSKgel G2500PWx1 and a TosoHaas TSKgel G2500 Wx1 30 cm×8 mm column, held at 40 C. The mobile phase used was this solution at a flow rate of 1 ml/min. Detection was via a differential refractive index measurement. The system was calibrated with narrow poly(acrylic) acid standards.

Engineered Copolymer I: To a 1 liter, 4-neck flask equipped with a mechanical stirrer, a reflux condenser, a thermocouple, and septum inlets was added 575.00 gram (g) deionized (D.I.) water and 5.00 g of 0.15 weight % $FeSO_4.7H_2O$. To this stirred solution at 60° C., 20.00 g of a monomer mixture containing 109.00 g of glacial methacrylic acid and 91.00 g of glacial acrylic acid was added. At 65° C., 0.50 g of sodium persulfate in 10.00 g D.I. water and 4.00 g sodium metabisulfite in 30.00 g D.I. water were added linearly and separately over 130 min. Ten minutes later, the remaining monomer mixture was added linearly over 120 min., at 72° C. After addition, the solution was held at temperature for 10 min., then cooled to 62° C. Next, 0.12 g of sodium persulfate in 5.00 g D.I. water was added. The solution was held for 10 min. and the procedure repeated. The stirred solution was adjusted with 20.20 g of 50% sodium hydroxide and 2.70 g of 30% hydrogen peroxide. Next, 0.25 g of isoascorbic acid in 5.00 g D.I. water was added. The solution was held for 5 min. and the procedure repeated. The aqueous copolymer solution at pH 3.8 had a solids content of 24.3%, 548 ppm of acrylic acid, no detectable methacrylic acid and a molecular weight (MW) of 178,700.

Engineered Copolymer II: To a 1 liter, 4-neck flask equipped with a mechanical stirrer, reflux condenser, thermocouple, and septum inlets was added 575.00 g of D.I. water and 5.00 g of 0.15 weight % $FeSO_4.7H2O$. To this stirred solution at 72° C., 1.00 g of sodium persulfate in 10.00 g D.I. water, 12.00 g sodium metabisulfite in 60.00 g D.I. water and a mixture containing 109.00 g of glacial methacrylic acid and 91.00 g of glacial acrylic acid were added linearly and separately over 120 min. After addition, the solution was held at temperature for 10 min., cooled to 62° C. and followed by the addition of 0.12 g sodium persulfate in 5.00 g D.I. water. The solution was held at temperature for 10 min. and another 0.12 g of sodium persulfate in 5.00 g D.I. water was added. The stirred solution was adjusted with 20.20 g of 50% sodium hydroxide and 6.00 g of 30% hydrogen peroxide. Next, 0.25 g of isoascorbic acid in 5.00 g D.I. water was added. The solution was held for 5 min. and the procedure repeated. The aqueous copolymer solution at pH 3.6 had a solids content of 24.3%, 426 ppm of acrylic acid, no detectable methacrylic acid and a MW of 28,800.

Polishing compositions individually containing engineered copolymers I and II were then utilized to polish copper patterned wafers on an AMAT Mirra polishing machine. Polishing was performed under the following conditions: First step at 5 psi down force, 93 rpm platen speed and 87 rpm carrier speed for 60 seconds; Second step at 3 psi down force, 93 rpm platen speed, 87 rpm carrier speed for 60 seconds. The first step of polishing was performed until endpoint was achieved on the AMAT Mirra as determined by the Mirra endpoint detection system. The second polishing step was terminated when the endpoint curve slope was zero. An IC1000 (X-Y grooved) polishing pad available from Rodel, Inc., Newark, Del. was used for each polishing test. The slurry flow rate was held constant at 250 ml/min during each polishing test. A tencor P1 profilometer was used to measure dishing of 100 µm lines in the center, middle and edge of each test wafer. The data obtained during the various polishing tests are summarized in Table 1 below.

TABLE 1

| Sample | pH | Removal Rate (Angstroms/min) | Average Dishing (Angstroms) | Residuals |
|---|---|---|---|---|
| Control | 3.1 | 3,435 | 1,300 | Significant residuals |
| A1 | 3.0 | 5,394 | 1,920 | Clear/no residuals |
| A2 | 3.5 | 3,285 | 1,580 | Clear/no residuals |
| B1 | 3.0 | 4,611 | 1,350 | Clear/no residuals |
| B2 | 3.5 | 3,200 | 990 | Clear/no residuals |

All polishing compositions contained 9% hydrogen peroxide, 0.3% BTA and 0.22% malic acid. Polishing compositions A1 and A2 contained 0.36% of active engineered copolymer I. Polishing compositions B1 and B2 contained 0.36% of active engineered copolymer II. The remaining weight percentage of each polishing composition comprised water. The Control contained 0.18% of a 1:1 mixture of polyacrylic acids with number average molecular weights of 250,000 and 30,000, respectively.

EXAMPLE 2

Engineered copolymers III, IV and V were synthesized as described below.

Engineered Copolymer III:

To a 2 liter, 4-neck round bottom flask equipped with a mechanical stirrer, reflux condenser, thermocouple, and septum inlets was added 700.00 g of D.I. water and 6.00 g of 0.15 weight % $FeSO_4.7H2O$. To this stirred solution at 80° C., 13.50 g of sodium persulfate in 100.00 g D.I. water; 75.00 g of 50% sodium hydroxide and a mixture containing 106.00 g of glacial methacrylic acid and 160.00 g hydroxyethyl methacrylate were added linearly and separately over 125 min. as the kettle temperature was allowed to rise to 92° C. After addition, the solution was held for 30 min. and 0.20 g sodium persulfate in 1.00 g D.I. water was then added. The solution was held at temperature for 10 min. and the procedure repeated with 0.50 g sodium persulfate in 4.00 g D.I. water. The aqueous copolymer solution at pH 6.2 had a solids content of 25.9%, 1450 ppm methacrylic acid and a MW of 20,100.

Engineered Copolymer IV:

To a 2 liter, 4-neck round bottom flask equipped with a mechanical stirrer, reflux condenser, thermocouple, and septum inlets was added 577.00 g of D.I. water and 3.00 g of 0.15 weight % $FeSO_4.7H2O$. To this stirred solution at 88° C., 10.20 g of sodium persulfate in 50.00 g D.I. water, 99.00 g of 50% sodium hydroxide and a mixture containing 206.50 g of glacial methacrylic acid and 132.60 g hydroxyethyl methacrylate were added linearly and separately over 125 min. After addition, the solution was held at 88 to 90° C. for 55 min. and 1.10 g sodium persulfate in 7.20 g D.I. water was then added and the solution held at temperature for 60 min., cooled to 65° C. and diluted with 40.00 g D.I. water. The aqueous copolymer solution at pH 5.9 had a solids content of 34.0%, 397 ppm methacrylic acid and a MW of 14,100.

Engineered Copolymer V:

To a 2 liter, 4-neck round bottom flask equipped with a mechanical stirrer, reflux condenser, thermocouple, septum inlets and containing 800.00 g D.I. water at 86° C. was added; 0.25 g of inhibitor, 70.80 g of a 1.75 wt % surfactant solution, 68.30 g of a monomer emulsion, containing 300.00 g D.I. water, 2.20 g of a 30% surfactant solution, 325.00 g of methyl methacrylate, and 4.20 g of glacial methacrylic acid followed by 2.30 g of sodium persulfate in 16.7 g D.I. water. After addition, the kettle material was held at 86° C. for 15 minutes. To the remaining monomer emulsion 23.00 g of a 30% surfactant solution, 248.50 g of glacial methacrylic acid, and 5.70 g of n-dodecyl mercaptan was added followed by 30.00 g of rinse water. This monomer emulsion was added linearly over 120 min. to the kettle at 85° C. After addition, the reaction was held at temperature for 15 min., cooled, then filtered through 100/325 mesh screens. The emulsion polymer at pH 2.8 had a solids content of 31.4%, 331 ppm of methacrylic acid, 171 ppm of methyl methacrylate, a MW of 56,400 and a particle size of 105 nm.

Table 2 summarizes removal rate data obtained, according to the method of this invention, utilizing polishing compositions containing engineered copolymers III, IV and V. All polishing compositions contained 0.36% of the respective engineered copolymer, 9% hydrogen peroxide, 0.3% BTA, and 0.22% malic acid. The remaining weight percentage of each polishing composition comprised water.

TABLE 2

| Engineered Copolymer | Molecular Weight (MW) | Removal Rate (Angstroms/minute) |
| --- | --- | --- |
| III | 20,100 | 1,500 |
| IV | 14,100 | 3,000 |
| V | 56,400 | <1,000 |

The data in Table 2 illustrates that removal rates in excess of 1,000 Angstroms per minute are obtained utilizing the method of this invention. The exemplified polishing compositions comprised engineered copolymers made from a mixture of monomers, wherein the mixture has greater than 50 mole % of acid-containing monomers.

The scope of the present invention is intended to be defined solely by the following claims and nothing within the above text is included to add any further limitation thereto.

We claim:

1. A method of polishing a semiconductor substrate, the method including polishing the semiconductor substrate with an aqueous polishing composition comprising at least one aqueous engineered copolymer, wherein the engineered copolymer comprises a first moiety and a second moiety, the first moiety comprising a hydrophilic functional group and the second moiety in combination with the first moiety providing structural rigidity to the aqueous engineered copolymer and the second moiety being less hydrophilic than the first moiety.

2. The method of claim 1 wherein polishing occurs with the first moiety having a hydrophilic functional group with an affinity for the semiconductor substrate.

3. The method of claim 1 wherein the polishing occurs with the second moiety having a hydrophobic functional group.

4. A method of polishing a semiconductor substrate, the method including polishing the semiconductor substrate with an aqueous polishing composition comprising at least one aqueous engineered copolymer, wherein the engineered copolymer comprises a first moiety and a second moiety, the first moiety comprising a hydrophilic functional group and the second moiety in combination with the first moiety providing structural rigidity to the aqueous engineered copolymer and the second moiety being less hydrophilic than the first moiety; and the aqueous polishing composition is abrasive-free.

5. The method of claim 4 wherein polishing occurs with the first moiety having a hydrophilic functional group with an affinity for the semiconductor substrate.

6. The method of claim 4 wherein the polishing occurs with the second moiety having a hydrophobic functional group.

7. The method of claim 4 wherein the polishing occurs with the engineered copolymer selected from a group consisting of random, block, branched and alternating copolymers.

8. The method of claim 4 wherein the polishing occurs with at least one engineered copolymer present at a concentration of less than about 1% by weight, and the polishing composition further comprises an oxidizing agent up to about 15% by weight, a complexing agent up to about 3% by weight and an inhibitor up to about 2% by weight of the polishing composition.

9. The method of claim 4 wherein the polishing occurs with the copolymer being derived from a mixture comprising acrylic acid monomer and methacrylic acid monomer at a mole ratio of acrylic acid monomer to methacrylic acid monomer of about 1:20 to about 20:1.

10. The method of claim 8 wherein the polishing occurs at a pH less than 5 and wherein the oxidizing agent is hydrogen peroxide, the complexing agent is malic acid and the inhibitor includes benzotriazole.

11. A method of polishing a semiconductor substrate, the method including polishing the semiconductor substrate with an aqueous polishing composition comprising at least one aqueous engineered copolymer, wherein the engineered copolymer comprises a first moiety and a second moiety, the first moiety comprising a hydrophilic functional group and the second moiety in combination with the first moiety providing structural rigidity to the aqueous engineered copolymer and the second moiety being less hydrophilic than the first moiety; and the copolymer being derived from a mixture comprising acrylic acid and methacrylic acid monomers.

12. The method of claim 11 wherein polishing occurs with the first moiety having a hydrophilic functional group with an affinity for the semiconductor substrate.

13. The method of claim 11 wherein the polishing occurs with the second moiety having a hydrophobic functional group.

14. The method of claim 11 wherein the polishing occurs with the polishing composition being abrasive-free.

15. The method of claim 11 wherein the polishing occurs with the at least one engineered copolymer is present at a concentration of less than about 1% by weight, and the polishing composition further comprises an oxidizing agent up to about 15% by weight, a complexing agent up to about 3% by weight and an inhibitor up to about 2% by weight of the polishing composition.

16. The method of claim 11 wherein the polishing occurs at a pH less than 5 and wherein the oxidizing agent is hydrogen peroxide, the complexing agent is malic acid and the inhibitor includes benzotriazole.

17. The method of claim 11 wherein the polishing occurs with a mixture of acrylic acid monomer and methacrylic acid monomer has a mole ratio of acrylic acid monomer to methacrylic acid monomer of about 1:20 to about 20:1.

18. The method of claim 11 where in the polishing occurs with the engineered copolymer being a reaction product derived from a mixture of two or more ethylenically unsaturated monomers.

19. The method of claim 18 wherein the polishing occurs with at least 50% by weight of the mixture being from an unsaturated carboxylic acid monomer.

* * * * *